(12) United States Patent
Kundalgurki (10) Patent No.: US 7,018,893 B1
(45) Date of Patent: Mar. 28, 2006

(54) METHOD FOR FABRICATING BOTTOM ELECTRODES OF STACKED CAPACITOR MEMORY CELLS

(75) Inventor: Srivatsa Kundalgurki, Dresden (DE)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 11/011,039

(22) Filed: Dec. 15, 2004

(51) Int. Cl.
*H01L 21/8242* (2006.01)

(52) U.S. Cl. ............... 438/254; 438/255; 438/244; 257/303

(58) Field of Classification Search ............ None
See application file for complete search history.

(56) References Cited

U.S. PATENT DOCUMENTS

| | | | |
|---|---|---|---|
| 6,348,709 B1 * | 2/2002 | Graettinger et al. | 257/311 |
| 2005/0127426 A1 * | 6/2005 | Nishikawa | 257/309 |

OTHER PUBLICATIONS

C.H. Mastrangelo, Mechanical Stability and Adhesion of Microstructures Under Capillary Forces—Part I: Basic Theory, Journal of Microelectromechanical Systems, vol. 2, No. 1, Mar. 1993, pp. 33-43.

C.H. Mastrangelo, Suppression of Stiction in MEMS, 1999 Spring MRS Meeting, Boston, MA, 1999, pp. 1-12.

Jung-Mu Kim et al., Continuous Anti-Stiction Coatings Using Self-Assembled Monolayers for Gold Microstructures, Journal of Micromechanics and Microengineering, 12 (2002) pp. 688-695.

* cited by examiner

*Primary Examiner*—Chandra Chaudhari
*Assistant Examiner*—Victor V. Yevsikov
(74) *Attorney, Agent, or Firm*—Edell, Shapiro & Finnan, LLC (57) ABSTRACT

Bottom electrodes of stacked capacitor cells are formed by lining a patterned hard mask with a conductive layer. The hard mask is formed by a layered stack. Subsequent to the formation of trenches within the hard mask, the top-most masking layer of the layer stack is laterally recessed. The bottom electrode layer is then deposited to line the trenches. Following this, the bottom electrode layer is removed from the top of the hardmask. Subsequently, the hard mask is removed. As a result, released and free-standing elements of the conductive layer are formed as bottom electrodes that include a hydrophobic contact area in the top part of the bottom electrodes.

20 Claims, 5 Drawing Sheets

METHOD FOR FABRICATING BOTTOM ELECTRODES OF STACKED CAPACITOR MEMORY CELLS

FIELD OF THE INVENTION

The invention relates to a method for fabricating bottom electrodes of stacked capacitor memory cells. The invention particularly relates to the field of wet etching a patterned hard mask layer to fabricate free standing bottom electrode structures on a semiconductor wafer.

BACKGROUND

The manufacturing of integrated circuits aims for continuously decreasing feature sizes of the fabricated components. For certain components, like capacitors, shrinking adversely affects the properties of the component. In order to achieve a minimum value of capacitance, it is therefore necessary to maintain the surface area of the capacitor above a threshold value. This is in particular important for dynamic random access memory cells (DRAM) which call for high integration densities.

As the surface area for a single memory cell decreases, the capacity of the storage capacitor is decreasing as well. For proper operation of the memory cell, a certain minimum capacity (typically in the order of 30 femto farad) is mandatory for the storage capacitor. If the capacity of the storage capacitor is too small, the charge stored in the storage capacitor is not sufficient to produce a detectable signal. In such a case, the information stored in the memory cell is lost and the memory cell is not operating in the desired way.

Several concepts have been developed to overcome the problems associated with shrinking feature sizes by integrating capacitors of DRAM cells in a three dimensional way.

A first example introduces deep trench capacitors which are formed in the substrate of a semiconductor wafer to maintain a large capacitor area with a high capacity while using only a small amount of the surface of the substrate. The selection or access transistor is usually formed on the planar surface of the substrate.

In another example, stacked capacitors are used which are formed on top of a planar surface on the substrate. The selection transistors are formed below the planar surface. The stacked capacitor comprises a first electrode and a second electrode having a dielectric layer in-between. The first electrode (also called bottom electrode) is usually formed as a cylindrical structure on the surface of the substrate by lining trenches of a patterned sacrificial mold layer with the electrode material. Afterwards, the bottom electrodes are released by etching the sacrificial layer. Subsequently, the surface of the, e.g. cylindrical shaped, bottom electrodes are cleaned to be prepared for further processing including disposing the dielectric layer and the second or top electrode.

However, with decreasing feature sizes of structures, etching and/or cleaning steps become increasingly difficult. Etching and/or cleaning are usually performed by wet processing. Standard wet processing, e.g. rinsing the wafer with ultra pure deionized water for cleaning purposes, introduces capillary forces between neighboring structures, i.e. between adjacent bottom electrodes. With reduced feature sizes, this may lead to adhesion of neighboring structures mediated by the cleaning liquid, usually referred to as "stiction". Stiction is primarily important during drying steps which usually follow the etching and cleaning steps in semiconductor wafer processing. There, capillary forces induced by the liquid lead to adhesion of adjacent bottom electrodes. The adjacent bottom electrodes remain stuck to each other even after being completely dried, if the adhesion force between the contacting adjacent bottom electrodes is larger than the elastic restoring force of the deformed bottom electrodes.

Additionally, exposing wafers to an air-liquid interface during transfer between etching, cleaning and drying process modules is one of the potential issues to be overcome in order to obtain stiction free process performance.

Failing to achieve stiction free process performance would ultimately result in a low yield of the produced circuits. One potential solution would be to completely avoid wet processing and perform etching steps using gas phase processing, e.g. in a hydrogen fluoride vapor. Disadvantageously, this processing leads to etching residues and to silicon surface termination states which hinders further processing.

SUMMARY

It is accordingly an object of the invention to provide a method for fabricating bottom electrodes of stacked capacitor memory cells which overcomes the above mentioned issues. It is a particular object of the invention to achieve a processing for fabricating bottom electrodes of stacked capacitor memory cells which reduces the risk of stiction.

The aforesaid objects are achieved individually and/or in combination, and it is not intended that the present invention be construed as requiring two or more of the objects to be combined unless expressly required by the claims attached hereto.

In accordance with the invention, a method for fabricating bottom electrodes of stacked capacitor memory cells comprises the steps of: providing a semiconductor wafer including a substrate; forming a plurality of contact plugs on the surface of the substrate; depositing a layer stack as a hard mask on the surface of the substrate and the plurality of contact plugs, the layer stack comprising at least a first mask layer, a second mask layer, and a third mask layer, wherein the first mask layer is deposited on the surface of the substrate and the plurality of contact plugs, the second mask layer is deposited on the first mask layer and the third mask layer is deposited on the second mask layer; etching a plurality of trenches into the hard mask, each of the trenches being located above and aligned with a respective contact plug and ranging from the surface of the third mask layer to the respective contact plug; partially etching the third mask layer to laterally recess the third mask layer with respect to sidewalls of the trenches formed within the hard mask; depositing a conductive layer on the surface of the hard mask, the conductive layer covering the side walls of the trenches and the contact plugs; removing the third mask layer by etching; removing the second mask layer by etching to separate portions of the conductive layer such that the separate portions form bottom electrodes; and wet cleaning the semiconductor wafer to provide a substantially residue free surface on each of the bottom electrodes.

According to the invention, bottom electrodes of stacked capacitor cells are formed by lining a patterned hard mask with a conductive layer. The hard mask is formed by a layered stack. Once trenches have been formed within the hard mask, the top-most masking layer of the layer stack is laterally recessed. The bottom electrode is deposited to line the etched trenches. Subsequently, the bottom electrode is removed from the top of the mask before the hard mask is etched. As a result, released and free-standing elements of the conductive layer are formed as bottom electrodes.

The hard mask serves as a mold during lining the trenches with the conductive layer. Due to the lateral recessing of the top-most masking layer of the layer stack, the bottom electrodes comprise laterally protruding elements at the top part.

During subsequent wet processing, e.g., cleaning and drying, adjacent bottom electrodes experience capillary forces. The capillary forces lead to stiction of neighboring bottom electrodes such that physical contact between neighboring bottom electrodes can occur. Once a physical contact has been established, pinning of the contacting surfaces can occur due to adhesion. The laterally protruding elements form contact pads during contact adhesion.

Accordingly, the laterally protruding elements reduce the strength of contact adhesion which is proportional to the size of the contact area. Thus the risk of stiction is reduced both in presence and in absence of a liquid medium between the protruding elements.

In a particularly advantageous aspect of the invention, the step of depositing a conductive layer comprises depositing doped amorphous silicon as the conductive layer. In this embodiment, the risk of stiction is further reduced by providing a material for the bottom electrodes which serves as a hydrophobic contact pad. An increase of hydrophobicity of the contact pad enhances the anti-stiction tendency. Hydrophobicity is a material property and describes whether a liquid has a wetting, spreading or repelling behavior on the surface of the material. Hydrophobicity is numerically described by the so-called contact angle. Lower values of the contact angle correspond to more hydrophilic behavior.

Oxide free amorphous silicon has a contact angle of approximately 67°, which leads to a reduction of capillary forces as compared to other materials like silicon nitride which has a contact angle of approximately 37°. Lower capillary forces enhance the possibility that the elastic force of the bent bottom electrode is large enough to overcome the contact adhesion, as described above. Consequently, the hydrophobic contact pad approach as taught by the invention enables further shrinking of the bottom electrodes, e.g., wall thickness, and/or increasing the height of the bottom electrodes, as lower elastic forces are required for the release.

In a further particularly advantageous aspect of the invention, the step of depositing a hard mask comprises depositing silicon nitride as the third mask layer. In this embodiment, silicon nitride is employed as third mask layer. Silicon nitride can be etched with high selectivity to other materials.

In a further particularly advantageous aspect of the invention, silicon nitride is conformly deposited on the semiconductor wafer with a thickness in the range between 50 nm and 500 nm.

The size of the contact pad is defined by the thickness of the silicon nitride layer. Accordingly, the thickness of the silicon nitride layer is engineered to optimize the required contact pad surface area to minimize stiction.

In a further particularly advantageous aspect of the invention, the step of depositing a conductive layer on the surface of the hard mask comprises conformably depositing the conductive layer, and subsequently performing the following steps: filling the trenches with a fill material comprising silicon oxide; removing the conductive layer on the top surface of the hard mask by chemical mechanical polishing; and removing the fill material from within the trenches. In this embodiment the conductive layer is removed on the top surface of the mask layer by chemical mechanical polishing. The bottom electrode structures are filled with a fill material in order to eliminate the risk of residues remaining in the inner part of the bottom electrode elements.

The above and still further objects, features and advantages of the present invention will become apparent upon consideration of the following detailed description of specific embodiments thereof, particularly when taken in conjunction with the accompanying drawings, where like numerals designate like components.

DETAILED DESCRIPTION

An exemplary embodiment of the method according to the invention is discussed in detail below. It will be appreciated, however, that the present invention provides many applicable inventive concepts that can be embodied in a wide variety of specific contexts. The specific embodiments discussed are merely illustrative of specific ways to apply the method of the invention, and do not limit the scope of the invention.

Figure 1:
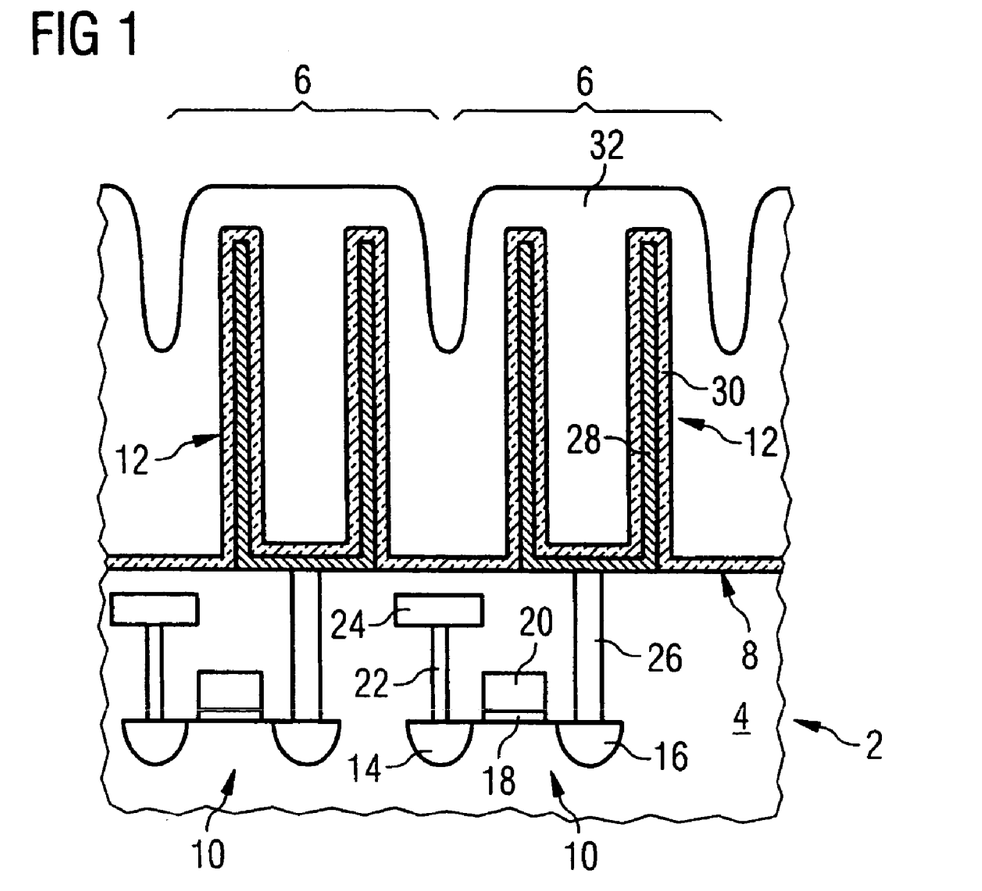
FIG. 1 depicts a side view in partial cross-section of a semiconductor wafer including a plurality of stacked capacitor DRAM-cells.

FIG. 1 depicts a side view of stacked capacitor DRAM-cells. It should be appreciated that FIG. 1 merely serves as an illustration of fabricating stacked capacitor DRAM-cells, and the individual components shown in FIG. 1 are not at true scale.

Referring to FIG. 1, a semiconductor wafer 2 includes a substrate 4 of semi-conductive material, e.g. silicon. The semiconductor wafer 2 is used for fabricating a plurality of stacked capacitor DRAM cells 6. Each DRAM cell 6 includes a selection transistor 10 and a stacked capacitor 12. The stacked capacitor 12 is located above the substrate surface 8.

The transistor 10 is located in the substrate 4. The transistor 10 is formed by a first junction 14 and a second junction 16. A gate 20 is disposed above a gate dielectric layer 18 between the first junction 14 and the second junction 16. The gate 20 may include a stack of several layers, e.g. silicon and tungsten. The stack of several layers reduces the resistance of the gate 20. The gate 20 also serves as a word line for addressing a specific DRAM cell 6 of the plurality of DRAM cells during operation.

The first junction 14 is connected to a bitline contact 22. The bitline contact 22 is disposed above the first junction 14. The bitline contact 22 is connected to a bitline 24 which is located above the bitline contact 22. The bitline 24 serves as a write or read line during operation.

The second junction 16 is connected to a contact plug 26. The contact plug 26 is disposed above the second junction 16. The contact plug 26 serves as a connection to a bottom electrode 28 of the capacitor 12. The bottom electrode 28 of the capacitor 12 is located above the substrate surface 8.

In FIG. 1, the bottom electrodes 28 are shown in a cross section. For the three dimensional shape of the bottom electrode 28, many different geometries can be used including cylindrical, elliptical or rectangular. As shown in FIG. 1, the bottom electrode 28 is formed with vertical side walls above the contact plug 26. However, non vertical side walls or side walls being laterally recessed are also conceivable.

The bottom electrode 28 of the capacitor 12 is covered by a dielectric layer 30 which serves as the dielectric of capacitor 12. A top electrode 32 is disposed above the dielectric layer 30. The top electrode 32 of the capacitor 12 is usually common to all DRAM cells 6 thus providing a connection between adjacent DRAM cells 6.

To a person skilled in the art, it is known that other elements might be necessary or desirable to fabricate working DRAM cells 6. For example, an insulation between adjacent transistors 10 might be necessary in certain applications to avoid electrical shorts to adjacent junction regions. In addition, a barrier layer between the contact plug 26 and the bottom electrode 28 may eliminate diffusion of different materials.

As another example, an isolation material can be disposed around the contact plugs 26 to avoid shorts to adjacent DRAM cells 6. It is also possible to dispose the bitline 24 on top of the top electrode 32 of the capacitor 12 by using a prolonged bitline contact 22.

Referring now to FIGS. 2A–2F, a method according to the invention is described which is suitable for fabricating bottom electrodes of DRAM memory cells as shown in FIG. 1. The method according to the invention provides in a first step the semiconductor wafer 2 used for fabricating the stacked capacitor DRAM cells 6. The semiconductor wafer 2 includes the substrate 4. In the substrate 4, transistors 10, bitlines 24, and other elements of the DRAM cell 6 have been formed for each DRAM cell 6 (not shown in FIG. 2A).

Figure 2A:
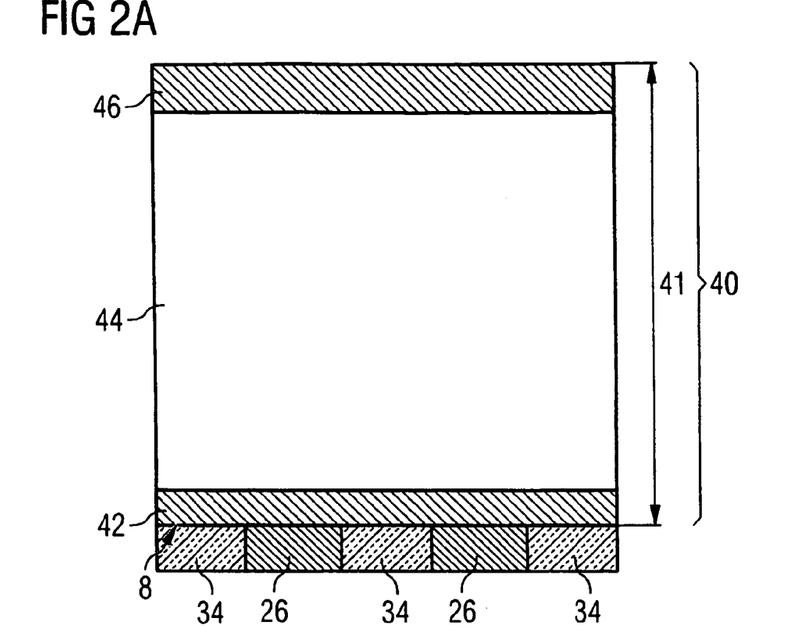
FIGS. 2A to 2F depict side views in partial cross-section of parts of a stacked capacitor DRAM-cell when applying the method steps according to the invention.

In FIG. 2A, an insulation material 34 is shown on the surface 8 of the substrate 4. The insulation material 34 surrounds the side walls of the contact plugs 26, i.e. providing an electrical insulation between adjacent contact plugs 26. The insulation material 34 comprises, for example, silicon dioxide. Other suitable materials might be applied as well.

The contact plugs 26 preferably have a low resistance and are made of, e.g., arsenic doped amorphous silicon. As an example, in a technology providing 70 nm minimal feature size, adjacent contact plugs 26 are spaced at a distance ranging from 50 nm to 200 nm.

A hard mask 40 is disposed on the surface 8 of substrate 4. According to the invention, a stack of several layers is used as hard mask 40. A first mask layer 42 is deposited on the surface 8 of substrate 4 and contact plugs 26. Subsequently, a second mask layer 44 is deposited on the first mask layer 42. Then, a third mask layer 46 is deposited on the second mask layer 44, as shown with respect to FIG. 2A.

For the first mask layer 42, boron silicate glass or silicon nitride is deposited. Subsequently, an undoped silicate glass is deposited as second mask layer 44. The third mask layer 46 includes, e.g., silicon nitride.

The hard mask 40 serves later as a mold for the bottom electrode 28 of the stacked capacitor DRAM cell 6. Accordingly, the thickness 41 of the hard mask directly affects the height of the bottom electrode 28 and, as a consequence, the capacitance of stacked capacitor 12.

Accordingly, the hard mask 40 must have a certain thickness which can be approximately 2 μm, e.g., for the 70 nm technology. However, other values for the thickness 41 in the range of 1 μm to 10 μm might also be used. As shown in FIG. 2A, the second mask layer 44 covers the largest part of the layer stack of hard mask 40.

As explained above, the third mask layer 46 serves as a contact pad in case stiction is experienced. Therefore the thickness of the third mask layer 46 must be chosen to satisfy the desired area of the contact pad. Accordingly, the thickness of the third mask layer 46 can be in the range between 50 nm and 500 nm. For the 70 nm technology, a thickness of the third mask layer 46 of approximately 50 nm to 100 nm is preferred.

Figure 2B:
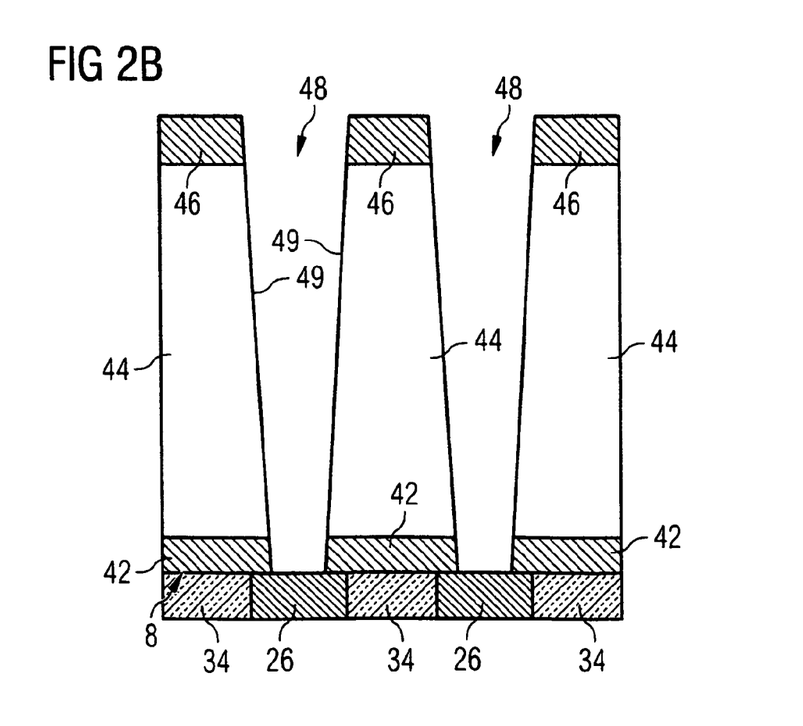

After the hard mask 40 has been deposited, a plurality of trenches 48 are formed in the mask layer 40. A photo lithographic patterned resist can be applied to define the regions of the trenches 40. Each trench 48 is arranged above and aligned with a respective contact plug 26, as shown in FIG. 2B.

The trenches 48 are formed using a reactive ion etching step. During the etching step, material of the mask layer 40 is removed, thus forming the trench 48 from the top surface of the third mask layer 46 to the contact plugs 26. As a result, the bottom of each trench 48 is formed by or adjacent with a respective contact plug 26 while the side walls 49 of the trench are formed within hard mask 40. As it is shown in FIG. 2B, etching of trenches 48 preferably leads to side walls 49 which have a continuously decreasing width from the top to the bottom of the hard mask 40. As an example, each trench has a width in the range of 50 nm to 200 nm in the center of the trench 48.

After etching the trenches 48 into the mask layer 40, the third mask layer 46 is partially etched. During this process step, the third mask layer 46 is laterally recessed at the locations defining sidewall surfaces of the trenches, which results in an enlarged width 47 of third mask layer 46 (as illustrated in FIG. 2C) in comparison to the width of the trench 48.

Figure 2C:
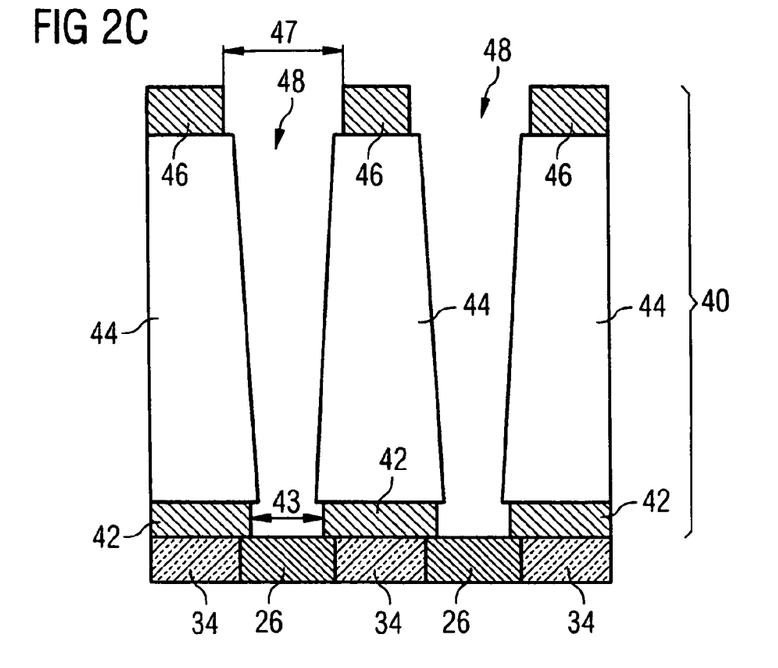

Since the etchant can possibly also react with the first mask layer 42, the first mask layer 42 can also become laterally recessed at the locations defining sidewall surfaces of the trenches (as shown in FIG. 2C), which results in an enlarged width 43 of the first mask layer 42. In addition, during this partial etching step, the thickness of third mask layer 46 is also reduced. This reduction affects the area of the contact pad, as described above.

Figure 2D:
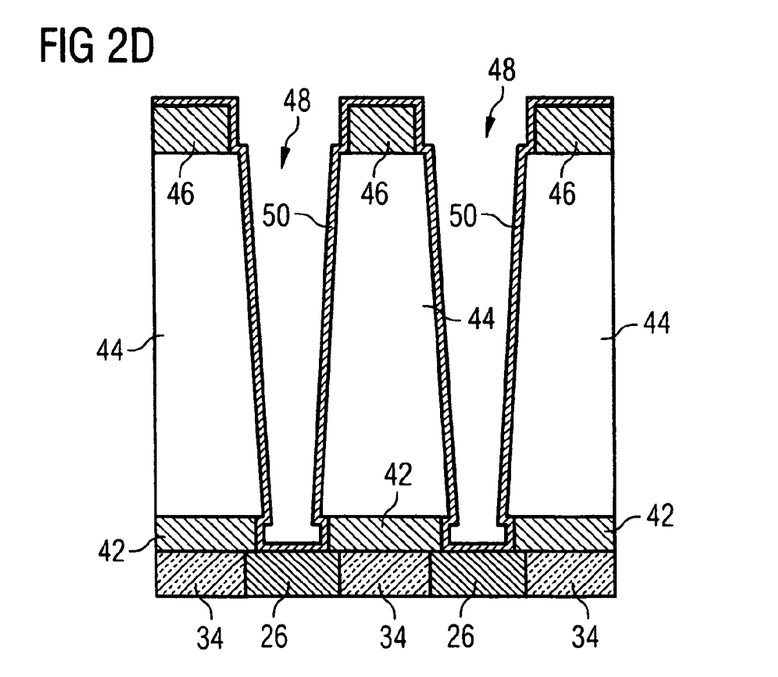

Subsequently, a conductive layer 50 is conformly deposited on the semiconductor wafer 2 (i.e., deposited along the exposed surfaces of the wafer, including within the formed trenches). In particular, the conductive layer 50 covers the top side of the hard mask 40, the trench side walls 49, and the bottom part of the trench 48, i.e. the contact plugs 26, as shown in FIG. 2D. Depositing the conductive layer 50 preferably includes using doped amorphous silicon as a suitable material for the conductive layer 50.

The conductive layer 50 serves later as the bottom electrode 28 of the stacked capacitor 12 of DRAM cell 6 once the hard mask 40 has been removed and the bottom electrodes are released. Therefore, the thickness of the conductive layer 50 affects the stability of the free-standing bottom electrodes 28.

In a further aspect, the thickness of the conductive layer 50 is also related to the elastic force, which is supposed to overcome contact adhesion in case of stiction, as explained above. Accordingly, the thickness of the conductive layer 50 has to be properly chosen. The thickness of the conductive layer 50 can be in the range between 10 nm and 100 nm. For the 70 nm technology, a thickness of conductive layer 50 of approximately 20–30 nm is preferred.

Figure 2E:
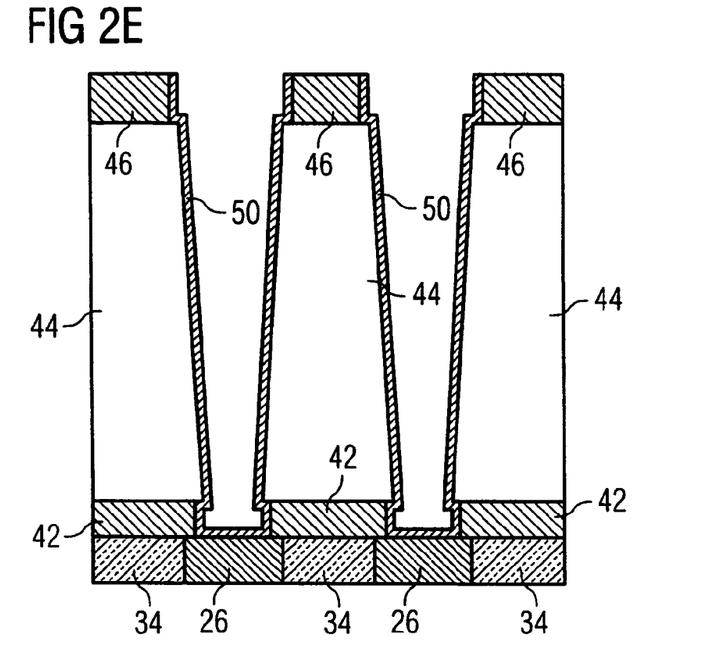

In the next process step, portions of the conductive layer 50 that are disposed between trenches 48 are removed from the top surface of the hard mask 40, as shown in FIG. 2E. In a first exemplary process sequence, the conductive layer 50 is removed by etching using a plasma etcher.

Alternatively (not shown in FIG. 2E), the trenches 48 are filled with a fill material, e.g., silicon oxide. Subsequently, portions of the conductive layer 50 disposed along the substrate between trenches 48 are removed from the top surface of the third mask layer 46 by chemical mechanical polishing. Then the fill material is removed from within the trenches 48. According to these process steps, the fill material protects the inner sides of the trenches 48 from residues which could present problems during later process steps (e.g., during deposition of the dielectric layer 30).

Figure 2F:
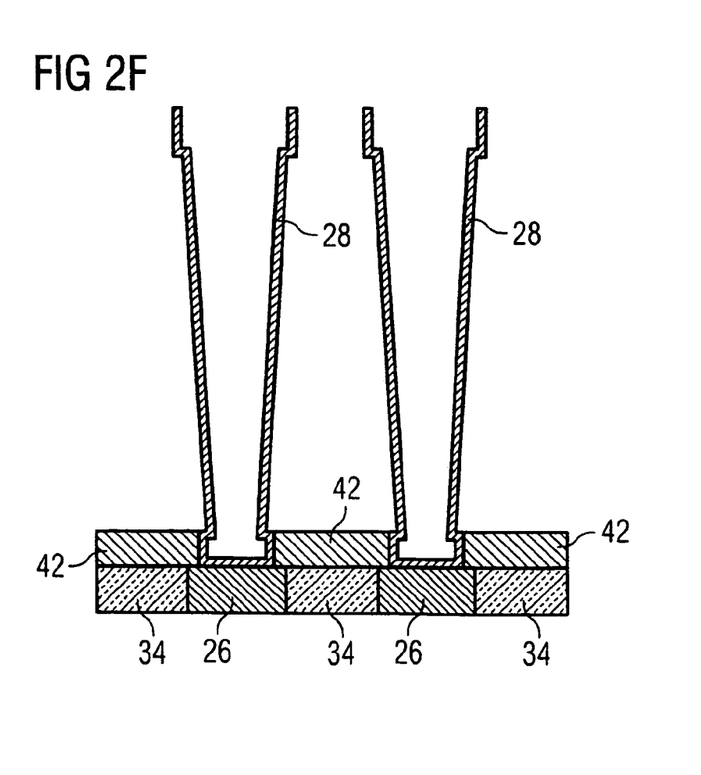

Referring to FIG. 2F, the next process step includes removing the third mask layer 46 and the second mask layer 44. This can be performed by a further wet etching step, using, e.g., phosphoric acid and hydrofluoric acid as etchants in successive processing steps. As a result, the remaining elements or portions of the conductive layer 50 are released or separated from each other (i.e., due to the removal of the mask layers disposed between the portions), thus forming the bottom electrodes 28.

Figure 3:
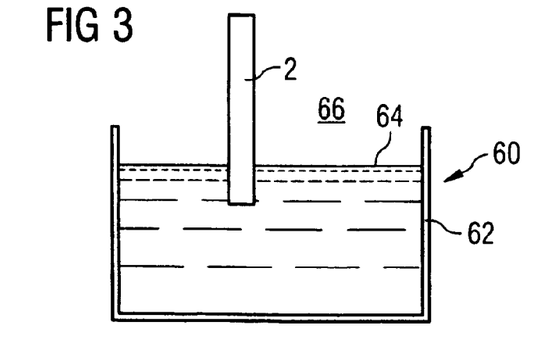
FIG. 3 depicts a wafer dryer in a side view when applying method steps according to the invention.

In order to create substantially residue free and interface free bottom electrodes 28, the wafer 2 has to be cleaned and dried. In FIG. 3, a wafer dryer 60 is shown which is used to perform the cleaning step according to the invention. The wafer dryer 60 includes a basin 62 for rinsing the wafer 2 with a cleaning liquid. The cleaning liquid can include water, including deionized water, alcoholic substances like methanol, or a mixture between water and alcohol. A drying area is located above the surface 64 of the cleaning liquid of the basin 62. The drying area 66 above the surface 64 of the cleaning liquid can include vapor of isopropyl alcohol and nitrogen.

The drying process includes immersing wafer 2 into the cleaning liquid. Subsequently, wafer 2 is gradually withdrawn from basin 62 into the drying area 66. Due to the gradient of surface tension and/or through evaporation in the alcohol/N2 atmosphere in the drying area 66, the emerging wafer surface is left free of moisture of the cleaning liquid. The cleaning liquid, e.g. water, is pulled back from the surface of the wafer 2 into the body of the cleaning liquid.

During the drying step following the wet etch step, the hydrophobic contact pad in combination with the reduced contact surface area between neighboring bottom electrodes minimizes the risk of stiction, thus increasing the yield of fabricating bottom electrodes for stacked capacitor DRAM cells.

After completion of the cleaning and drying steps, the wafer 2 is further processed to form, e.g., dielectric layer 30 and top electrode 32, as described above and depicted in FIG. 1.

Figure 4:
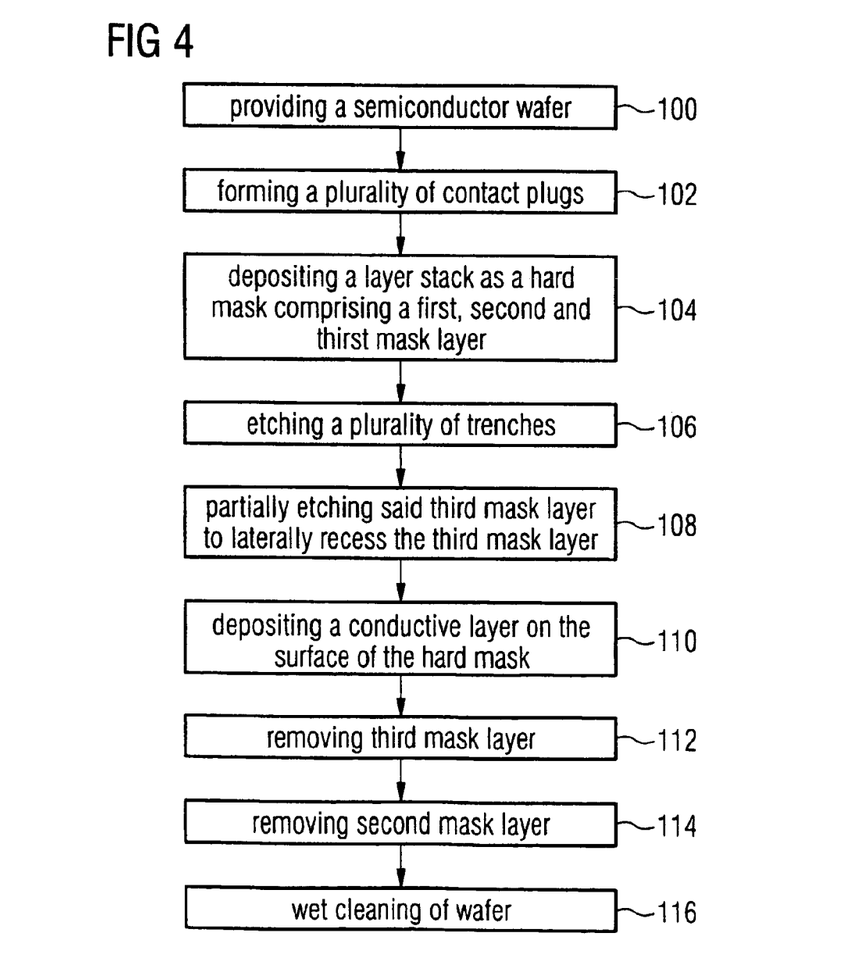
FIG. 4 depicts a flow chart of method steps according to another embodiment of the invention.

A sequence of process steps according to the invention with reference to FIG. 4 and further reference to the previous figures as described above. In step 100, a semiconductor wafer 2 having a substrate 4 is provided. In step 102, a plurality of contact plugs 26 are formed on the surface 8 of the substrate 4. In step 104, a hard mask 40 is deposited on the surface 8 of the substrate 4 comprising a first mask layer 42, a second mask layer 44, and a third mask layer 46. In step 106, a plurality of trenches 48 are etched into hard mask 40, wherein each trench 48 is located above or adjacent to a respective contact plug 26 and ranges from the surface of the third mask layer 46 to the respective contact plug 26. In step 108 the third mask layer 46 is partially etched to laterally recess the third mask layer 46 at sidewall surface locations of the trenches. In step 110, a conductive layer 50 is deposited on the surface of the hard mask 40 in a conforming manner with the exposed surfaces of the hard mask 40 so as to cover the side walls 49 of the trenches 48 and the contact plugs 26. The conductive layer 50 is then removed on top of the hard mask 40 by chemical mechanical polishing exposing the third mask layer 46. In step 112, the third mask layer 46 is removed by etching. In step 114, the second mask layer 44 is removed by etching to release or separate elements or portions of the conductive layer 50 so as to form bottom electrodes 28 (i.e., the conductive layer portions are separated from each other by removing the second and third mask layers from between the portions as described above and depicted in FIGS. 2E and 2F). In step 116, the semiconductor wafer 2 is wet cleaned to provide a substantially residue free surface on the bottom electrodes 28.

While the invention has been described in detail and with reference to specific embodiments thereof, variations and changes will be suggested to those skilled in the art in view of the teachings set forth herein. It is therefore to be understood that all such variations, modifications and changes are believed to fall within the scope of the present invention as defined by the appended claims.

REFERENCE NUMERALS 2 wafer
4 substrate
6 DRAM cell
8 substrate surface
10 transistor
12 capacitor
14 first junction
16 second junction
18 gate dielectric layer
20 gate
22 bitline contact
24 bitline
26 contact plug
28 bottom electrode
30 dielectric layer
32 top electrode
34 insulation material
40 hard mask
42 first mask layer
43 first width
44 second mask layer
45 second width
46 third mask layer
47 third width
48 trench
49 trench sidewall
50 conductive layer
60 wafer dryer
62 basin
64 cleaning liquid surface
66 drying area
100–116 process steps

What is claimed is:

1. A method for fabricating bottom electrodes of stacked capacitor memory cells, comprising the steps of:
   providing a semiconductor wafer including a substrate;
   forming a plurality of contact plugs on the surface of the substrate;
   depositing a layer stack as a hard mask on the surface of the substrate and the plurality of contact plugs, the layer stack comprising at least a first mask layer, a second mask layer, and a third mask layer, wherein the first mask layer is deposited on the surface of the substrate and the plurality of contact plugs, the second mask layer is deposited on the first mask layer and the third mask layer is deposited on the second mask layer;

etching a plurality of trenches into the hard mask, each of the trenches being located above and aligned with a respective contact plug and ranging from the surface of the third mask layer to the respective contact plug;

partially etching the third mask layer to laterally recess the third mask layer with respect to sidewalls of the trenches formed within the hard mask;

depositing a conductive layer on the surface of the hard mask, the conductive layer covering the side walls of the trenches and the contact plugs;

removing the third mask layer by etching;

removing the second mask layer by etching to separate portions of the conductive layer such that the separate portions form bottom electrodes; and wet cleaning the semiconductor wafer to provide a substantially residue free surface on each of the bottom electrodes.

2. The method of claim 1, wherein the conductive layer comprises doped amorphous silicon.

3. The method of claim 2, wherein the conductive layer comprising amorphous silicon includes a thickness in the range between 10 nm and 50 nm.

4. The method of claim 1, wherein the first mask layer comprises boron silicate glass or silicon nitride.

5. The method of claim 1, wherein the third mask layer comprises silicon nitride.

6. The method of claim 1, wherein the third mask layer includes a thickness in the range between 50 nm and 500 nm.

7. The method of claim 1, wherein the second mask layer comprises undoped silicate glass.

8. The method of claim 1, wherein the mask layer includes a thickness in the range of 1 µm to 10 µm.

9. The method of claim 1, wherein the plurality of contact plugs are formed on the surface of the substrate such that adjacent contact plugs are spaced at a distance ranging from 50 nm to 200 nm.

10. The method of claim 1, wherein the contact plugs include arsenic doped amorphous silicon.

11. The method of claim 1, wherein each trench etched within the hard mask has a width in the range of 50 nm to 200 nm.

12. The method of claim 1, wherein the step of partially etching the third mask layer comprises utilizing phosphoric acid as an etchant.

13. The method of claim 1, wherein the step of partially etching the third mask layer comprises laterally recessing the third mask layer at a lateral distance in the range of 10 nm to 100 nm with respect to sidewalls of the trenches formed within the hard mask.

14. The method of claim 1, wherein the step of depositing a conductive layer on the surface of the mask layer comprises conformably depositing the conductive layer and subsequently performing the following steps:

filling the trenches with a fill material comprising silicon oxide;

removing portions of the conductive layer disposed between the trenches and along top surface portions of the mask layer by chemical mechanical polishing; and removing the fill material within the trenches.

15. The method of claim 1, wherein the step of depositing a conductive layer on the surface of the mask layer comprises conformably depositing the conductive layer and subsequently performing the following step:

removing portions of the conductive layer disposed between the trenches and along top surface portions of the mask layer by etching using a plasma etcher.

16. The method of claim 1, wherein the step of wet cleaning further comprises providing a wafer dryer, the wafer dryer comprising a basin, the basin being filled with a cleaning liquid, and a drying area above the surface of the cleaning liquid.

17. The method of claim 16, wherein the drying area comprises a vapor atmosphere of isopropyl alcohol and nitrogen and wherein the cleaning liquid is selected from the group consisting of water, methanol, and mixtures thereof.

18. The method of claim 16, wherein the step of wet cleaning further comprises immersing the wafer into the cleaning liquid and withdrawing the wafer from the cleaning liquid so as to leave the emerging wafer surface free of moisture due to at least one of a gradient of surface tension of the cleaning liquid and and evaporation of water in an alcohol and nitrogen atmosphere in the drying chamber.

19. The method of claim 1, wherein the step of removing the third mask layer comprises utilizing phosphoric acid as an etchant.

20. The method of claim 1, wherein the step of removing the second mask layer comprises utilizing a compound including hydrofluoric acid as an etchant.

* * * * *